(12) United States Patent
Bernhardt et al.

(10) Patent No.: US 8,797,124 B2
(45) Date of Patent: Aug. 5, 2014

(54) PLANAR FILTER ASSEMBLY

(75) Inventors: Timothy Bernhardt, Meriden, CT (US); Jari Taskila, Meriden, CT (US); Yunchi Zhang, Wallingford, CT (US)

(73) Assignee: Alcatel Lucent, Boulogne-Billancourt (FR)

( * ) Notice: Subject to any disclaimer, the term of this patent is extended or adjusted under 35 U.S.C. 154(b) by 532 days.

(21) Appl. No.: 13/158,801

(22) Filed: Jun. 13, 2011

(65) Prior Publication Data

US 2012/0313733 A1    Dec. 13, 2012

(51) Int. Cl.
*H01P 1/203* (2006.01)
*H03H 7/01* (2006.01)
*H01P 7/06* (2006.01)
*H03H 7/06* (2006.01)

(52) U.S. Cl.
CPC ............ *H01P 1/20345* (2013.01); *H01P 1/203* (2013.01); *H03H 7/06* (2013.01)
USPC ............................. 333/204; 333/185; 333/227

(58) Field of Classification Search
USPC ......... 333/202, 205, 203, 227, 229, 219, 204, 333/235, 233, 231, 232
See application file for complete search history.

(56) References Cited

U.S. PATENT DOCUMENTS

| | | | | |
|---|---|---|---|---|
| 5,065,121 A | * | 11/1991 | Ghadaksaz | .................... 333/235 |
| 2002/0050872 A1 | * | 5/2002 | Terashima et al. | ........... 333/99 S |

\* cited by examiner

*Primary Examiner* — Stephen Jones
*Assistant Examiner* — Scott S Outten
(74) *Attorney, Agent, or Firm* — Kramer Amado, P.C.

(57) ABSTRACT

Various exemplary embodiments relate to a support assembly for a planar filter. The assembly includes a u-shaped housing with angled surfaces at the inner corners of the u-shape, a first dielectric plate having a first angled surface in contact with one of the angled surfaces of the housing, a second dielectric plate having a second angled surface in contact with the other angled surface of the housing, at least one compressible ring, and a cover. The planar filter is supported between the first dielectric plate and the second dielectric plate. The cover compresses the compressible ring to apply downward force on the first and second dielectric plates. The downward force is translated to an inward force by the angled surfaces of the housing. The angled surfaces of the housing apply an inward force on the first dielectric plate and the second dielectric plate.

20 Claims, 8 Drawing Sheets

PLANAR FILTER ASSEMBLY

TECHNICAL FIELD

Various exemplary embodiments disclosed herein relate generally to assemblies for supporting electronic filters.

BACKGROUND

Planar filter assemblies may be used to filter an electrical signal. The planar filter may be a flat, conductive strip whose shape may be designed to filter a particular range of frequencies. The planar filter may be in the form of a high-pass filter, a low-pass filter, a band-pass filter, or a band-stop filter.

SUMMARY

A brief summary of various exemplary embodiments is presented. Some simplifications and omissions may be made in the following summary, which is intended to highlight and introduce some aspects of the various exemplary embodiments, but not to limit the scope of the invention. Detailed descriptions of a preferred exemplary embodiment adequate to allow those of ordinary skill in the art to make and use the inventive concepts will follow in later sections.

Various exemplary embodiments relate to an assembly, including: a housing; a planar filter; a first dielectric plate having a first angled surface; and a second dielectric plate having a second angled surface, wherein the planar filter is supported between the first dielectric plate and the second dielectric plate, and wherein the first angled surface and the second angled surface interact with the housing to apply inward pressure on the planar filter.

In some embodiments, the assembly further includes at least one compressible ring, wherein the at least one compressible ring acts on the first dielectric plate and the second dielectric plate to apply inward pressure on the planar filter. In some embodiments, the assembly further includes a cover, wherein the cover compresses the at least one compressible ring. In some embodiments, the housing is u-shaped with angled surfaces at the inner corners of the u-shape, and the at least one compressible ring causes the first angled surface of the first dielectric plate and the second angled surface of the second dielectric plate to interact with the angled surfaces of the housing to apply inward pressure on the planar filter. In some embodiments, the housing compresses the at least one compressible ring. In some embodiments, the at least one compressible ring, the first angled surface of the first dielectric plate, and the second angled surface of the second dielectric plate interact with the housing to keep the planar filter substantially centered within the housing. In some embodiments, the first dielectric plate has at least one support post for contacting a first portion of the planar filter, and the second dielectric plate has at least one support post for contacting a second portion of the planar filter, and portions of the planar filter not contacted by the first dielectric plate and the second dielectric plate are exposed to air. In some embodiments, the first dielectric plate has a first alignment pin and a first alignment pin receiver, and the second dielectric plate has a second alignment pin and a second alignment pin receiver, and the first alignment pin extends through a first hole in the planar filter into the second alignment pin receiver, and the second alignment pin extends through a second hole in the planar filter into the first alignment pin receiver. In some embodiments, the first dielectric plate and the second dielectric plate are substantially identical.

Various exemplary embodiments further relate to an assembly, including: a housing; a planar filter; a first dielectric plate; a second dielectric plate; and at least one compressible ring, wherein the planar filter is supported between the first dielectric plate and the second dielectric plate, and wherein the at least one compressible ring acts on the first dielectric plate and the second dielectric plate to apply inward pressure on the planar filter.

In some embodiments, the first dielectric plate has a first angled surface, and the second dielectric plate has a second angled surface, and the first angled surface and the second angled surface interact with the housing to apply inward pressure on the planar filter. In some embodiments, the assembly further includes a cover, wherein the cover compresses the at least one compressible ring. In some embodiments, the housing is u-shaped with angled surfaces at the inner corners of the u-shape, and the at least one compressible ring causes the first angled surface of the first dielectric plate and the second angled surface of the second dielectric plate to interact with the angled surfaces of the housing to apply inward pressure on the planar filter. In some embodiments, the housing compresses the at least one compressible ring. In some embodiments, the at least one compressible ring, the first angled surface of the first dielectric plate, and the second angled surface of the second dielectric plate interact with the housing to keep the planar filter substantially centered within the housing. In some embodiments, the first dielectric plate has at least one support post for contacting a first portion of the planar filter, and the second dielectric plate has at least one support post for contacting a second portion of the planar filter, and portions of the planar filter not contacted by the first dielectric plate and the second dielectric plate are exposed to air. In some embodiments, the first dielectric plate has a first alignment pin and a first alignment pin receiver, and the second dielectric plate has a second alignment pin and a second alignment pin receiver, and the first alignment pin extends through a first hole in the planar filter into the second alignment pin receiver, and the second alignment pin extends through a second hole in the planar filter into the first alignment pin receiver. In some embodiments, the first dielectric plate and the second dielectric plate are substantially identical.

Various exemplary embodiments further relate to an assembly, including: a u-shaped housing with angled surfaces at the inner corners of the u-shape; a first dielectric plate having a first angled surface in contact with one of the angled surfaces of the housing; a second dielectric plate having a second angled surface in contact with the other angled surface of the housing; at least one compressible ring; and a cover, wherein the planar filter is supported between the first dielectric plate and the second dielectric plate, wherein the cover compresses the compressible ring to apply downward force on the first and second dielectric plates, wherein the downward force is translated to an inward force by the angled surfaces of the housing, and wherein the angled surfaces of the housing apply an inward force on the first dielectric plate and the second dielectric plate.

BRIEF DESCRIPTION OF THE DRAWINGS

In order to better understand various exemplary embodiments, reference is made to the accompanying drawings, wherein.

DETAILED DESCRIPTION

Referring now to the drawings, in which like numerals refer to like components or steps, there are disclosed broad aspects of various exemplary embodiments.

A planar filter may be surrounded by dielectrics and ground planes. The dielectrics and ground planes may allow the planar filter to achieve desired characteristics.

Figure 1:
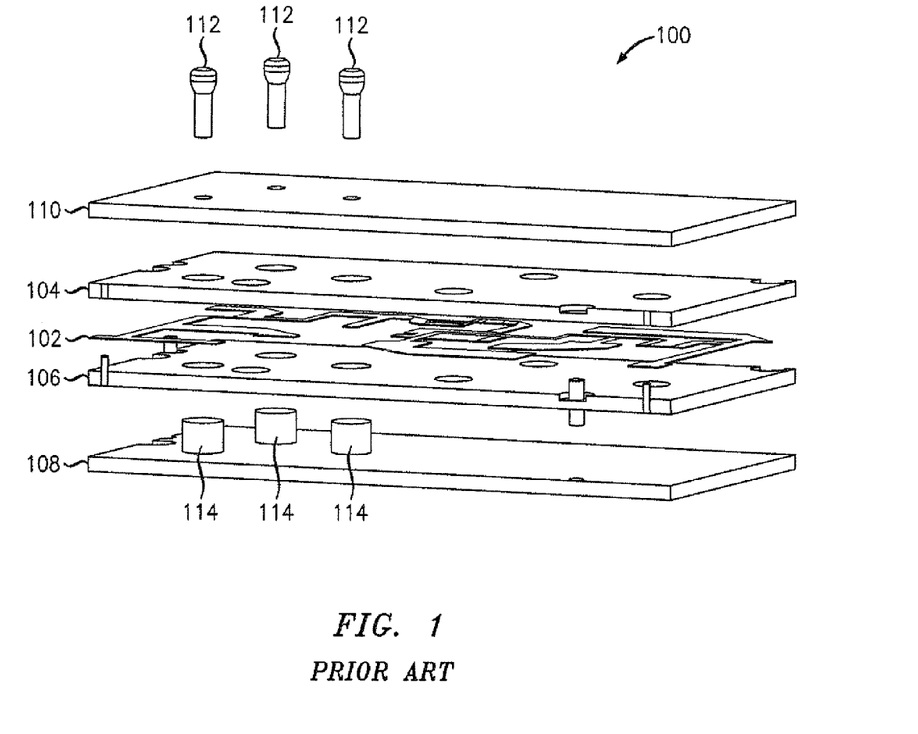
FIG. 1 illustrates a conventional horizontally stacked planar filter assembly.

FIG. 1 illustrates a conventional horizontally stacked planar filter assembly 100. A planar filter 102 may be held between a first dielectric plate 104 and a second dielectric plate 106. The planar filter 102, first dielectric plate 104, and second dielectric plate 106 may be clamped between a base 108 and a cover 110. The assembly 100 may be clamped together by inserting screws 112 through the cover 110 and into mounting holes 114 of the base 108.

The base 108 and cover 110 may form the ground planes of the filter. The distance between the planar filter 102 and the ground planes may influence the performance of the filter. The distance may be determined by the thickness of the first dielectric plate 104 and the second dielectric plate 106. Due to manufacturing tolerances, the two dielectric plates 104 and 106 may vary in thickness over the length and width of the filter. The variations in thickness of the dielectric plates 104 and 106 may alter the filter's performance.

When the temperature of the assembly 100 changes, the dielectric plates 104 and 106 may expand or contract at a higher rate than the base 108 and cover 110. As the dielectric plates 104 and 106 expand or contract, the distance between the planar filter 102 and the ground planes may change, further altering the filter's performance.

Figure 2:
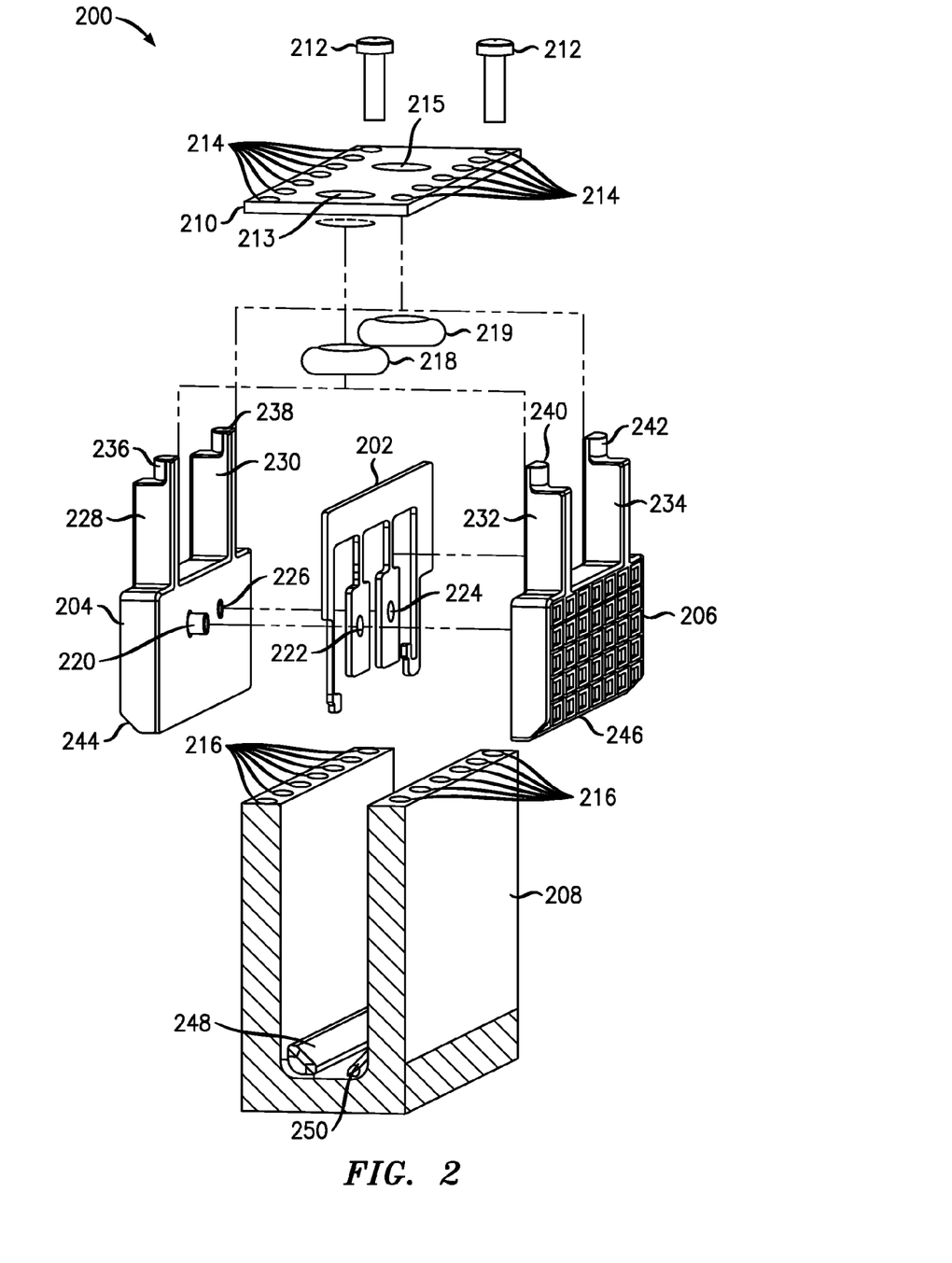
FIG. 2 illustrates an exploded view of an exemplary planar filter assembly.

FIG. 2 illustrates an exploded view of a planar filter assembly 200 according to an embodiment of the present invention. A planar filter 202, first dielectric plate 204, and second dielectric plate 206 may be inserted into a housing 208. A cover 210 may be secured to the upper face of the housing with screws 212. The screws 212 may extend through screw holes 214 in the cover 210 and into corresponding screw receivers 216 in the housing 208. While only two screws 212 are shown, additional screws may be used with the corresponding screw holes 214 and screw receivers 216. A first elastomer ring 218 may be inserted into the housing below a first clearance hole 213 in the cover 210. A second elastomer ring 219 may be inserted into the housing below a second clearance hole 215 in the cover 210.

The planar filter 202 may be constructed from, for example, copper or other conductive materials. The first and second dielectric plates 204 and 206 may be constructed from, for example, polypropylene, ceramic, Teflon, or other materials with a controlled dielectric. The housing 208 and cover 210 may be constructed from, for example, aluminum or other conductive materials. The first and second elastomer rings 218 and 219 may be constructed from, for example, silicon, rubber, or other compressible materials that maintain flexibility over a wide temperature range.

A first alignment pin 220 in the first dielectric plate 204 may extend through a first alignment hole 222 in the planar filter 202 and into a first alignment pin receiver (not shown) in the second dielectric plate 206. The second dielectric plate 206 may include a second alignment pin (not shown) that extends through a second alignment hole 224 in the planar filter 202 and into a second alignment pin receiver 226 in the first dielectric plate 204. The first dielectric plate 204 and the second dielectric plate 206 may be substantially identical.

The outer surfaces of the first and second dielectric plates 204 and 206 may have a "waffle" design, incorporating a plurality of holes or channels. The "waffle" design may reduce the effective dielectric constant of the first and second dielectric plates 204 and 206 by allowing more air to act as the dielectric. The "waffle" design may also allow the outer surfaces of the first and second dielectric plates 204 and 206 to be more easily molded with a flat profile.

The first dielectric plate 204 may include a first support 228 and a second support 230. The second dielectric plate 206 may include a third support 232 and a fourth support 234. A first upper self-alignment feature 236 may extend from the upper surface of the first support 228. A second upper self-alignment feature 238 may extend from the upper surface of the second support 230. A third upper self-alignment feature 240 may extend from the upper surface of the third support 232. A fourth upper self-alignment feature 242 may extend from the upper surface of the fourth support 234. The lower surface of the first dielectric plate 204 may be angled to form a first lower self-alignment feature 244. The lower surface of the second dielectric plate 206 may be angled to form a second lower self-alignment feature 246.

The first elastomer ring 218 may encircle the first and third upper self-alignment features 236 and 240. The first and third upper self-alignment features 236 and 240 may partially extend into the first clearance hole 213 in the cover 210. The second elastomer ring 219 may encircle the second and fourth upper self-alignment features 238 and 242. The second and fourth upper self-alignment features 238 and 242 may partially extend into the second clearance hole 215 in the cover 210.

The housing 208 may be "U"-shaped. The housing 208 may include a first angled surface 248 at one inner bend of the "U", and a second angled surface 250 at the other inner bend of the "U." The first lower self-alignment feature 244 may abut the first angled surface 248 of the housing 208. The second lower self-alignment feature 246 may abut the second angled surface 250 of the housing 208.

Figure 3:
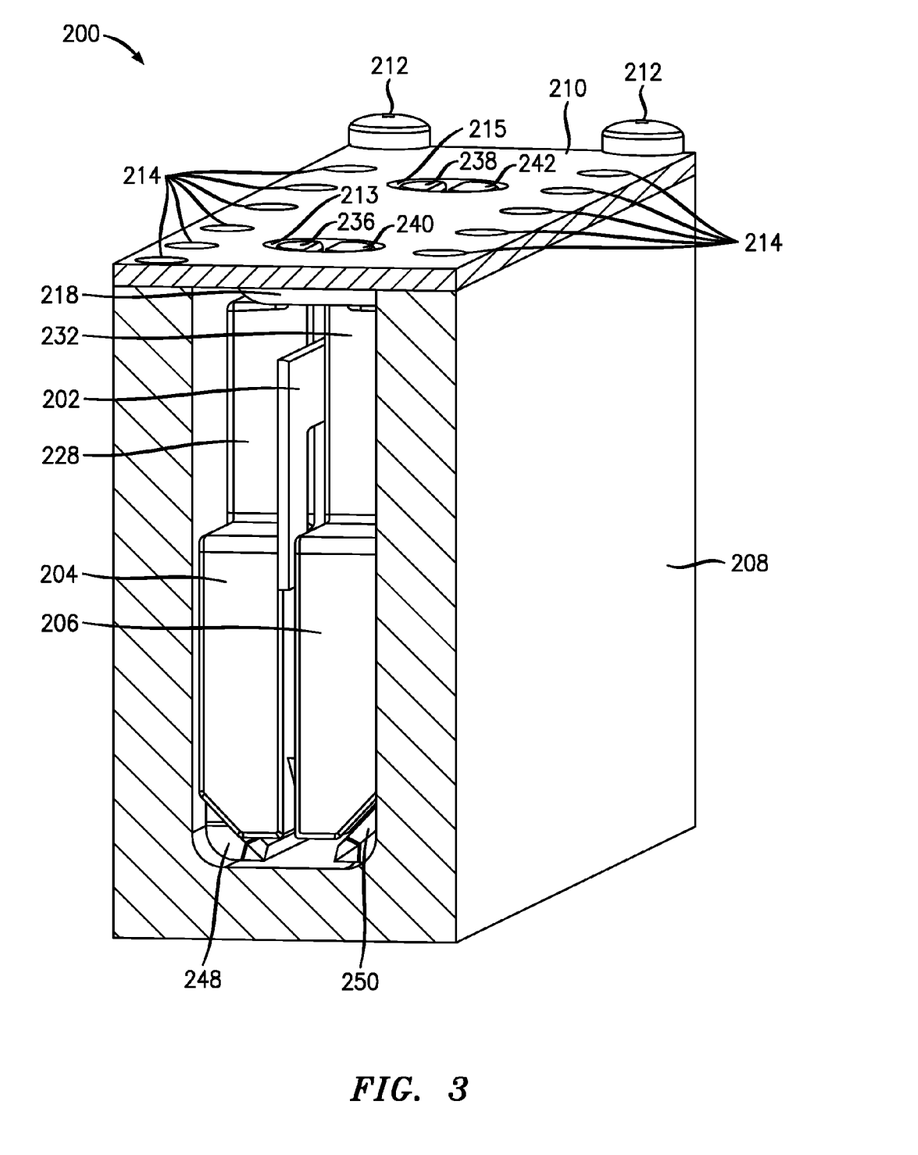
FIG. 3 illustrates an assembled view of the exemplary planar filter assembly of FIG. 2.

FIG. 3 illustrates an assembled view of the planar filter assembly 200. The planar filter 202, first dielectric plate 204, second dielectric plate 206, first elastomer ring 218, and second elastomer ring (not shown) may be inserted into the interior of the housing 208. The cover 210 may be secured to the housing 208 by inserting screws 212 through screw holes 214 and into the housing 210. While only two screws 212 are shown, additional screws may be used with the corresponding screw holes 214. The first and third upper self-alignment features 236 and 240 may extend into the first clearance hole 213 in the cover 210. The second and fourth upper self-alignment features 238 and 242 may extend into the second clearance hole 215 in the cover 210. The first dielectric plate 204 may abut the first angled surface 248 of the housing 208, and the second dielectric plate 206 may abut the second angled surface 250 of the housing 208.

Figure 4:
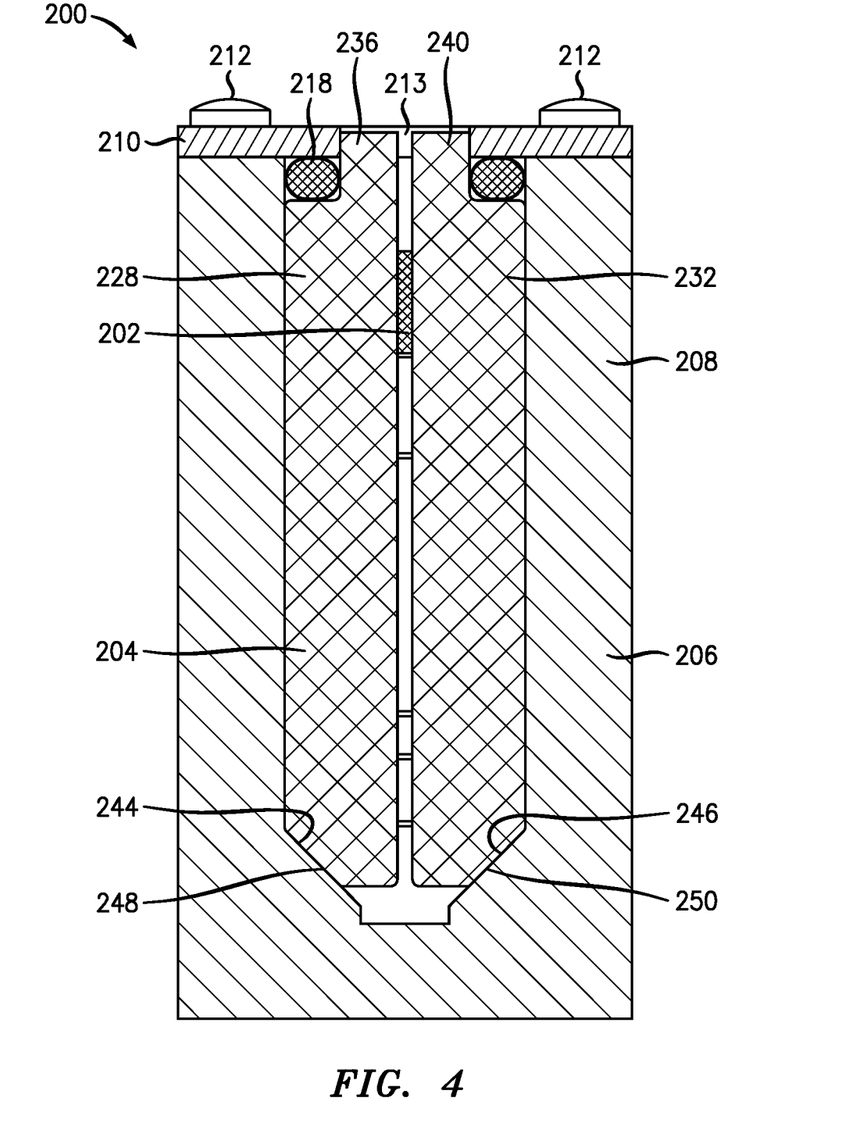
FIG. 4 illustrates a cross-sectional view of the exemplary planar filter assembly of FIG. 3.

FIG. 4 illustrates a cross-sectional view of the planar filter assembly 200. When the cover 210 is clamped to the housing 208 by the screws 212, the first elastomer ring 218 may be compressed. The compression of the first elastomer ring 218 may apply a downward force on the first and second dielectric plates 204 and 206 toward the angled surfaces 248 and 250 of the housing. The corresponding first and second lower self-alignment features 244 and 246 of the dielectric plates 204 and 206 may translate the downward force to an inward force toward the planar filter 202. The first elastomer ring 218 may also apply an inward force on the first and third upper self-alignment features 236 and 240 by being stretched around the first and third upper self-alignment features 236 and 240. The second elastomer ring 219 may apply similar forces on the second and fourth upper self-alignment features 238 and 242, and the first and second dielectric plates 204 and 206.

The first and second elastomer rings 218 and 219 may also be compressed against the upper inner walls of the housing 208. The compression of the first and second elastomer rings 218 and 219 against the upper inner walls of the housing 208, in combination with the downward force applied to the first and second lower self-alignment features 244 and 246, may keep the planar filter 202 substantially centered within the housing 208. The planar filter 202 may be substantially centered when small variations exist in the thickness of the first and second dielectric plates 204 and 206 due to manufacturing tolerances, thermal variations, or other defects.

If the planar filter assembly 200 changes temperature, the first dielectric plate 204, second dielectric plate 206, and housing 208 may expand or contract. The first and second dielectric plates 204 and 206 may expand or contract at a higher rate than the housing 208. As the first and second dielectric plates 204 and 206 expand or contract, the first and second elastomer rings 218 and 219 may apply consistent inward pressure on the planar filter 202 via the first, second, third, and fourth upper self-alignment features 236, 238, 240, and 242, and the first and second lower self-alignment features 244 and 246.

The planar filter assembly 200 may have improved filter performance compared to the conventional horizontally stacked planar filter assembly 100. In the planar filter assembly 200, the housing 208 may act as the ground planes. The planar filter assembly 200 may have less variation in the distance between the planar filter 202 and the ground planes due to thermal variations, manufacturing tolerances, or other defects in the first and second dielectric plates 204 and 206. The improved ability of the planar filter assembly 200 to absorb variations in the first and second dielectric plates 204 and 206 may allow the dielectric plates to be manufactured with less cost. The planar filter assembly 200 may also absorb shock and vibration more easily than the conventional horizontally stacked planar filter assembly 100, allowing the planar filter assembly 200 to be less susceptible to damage and repair. The planar filter assembly 200 may allow the planar filter 202 to return to a substantially centered position within the housing 208 after extreme temperature fluctuations and/or extreme shock and vibrations.

Figure 5:
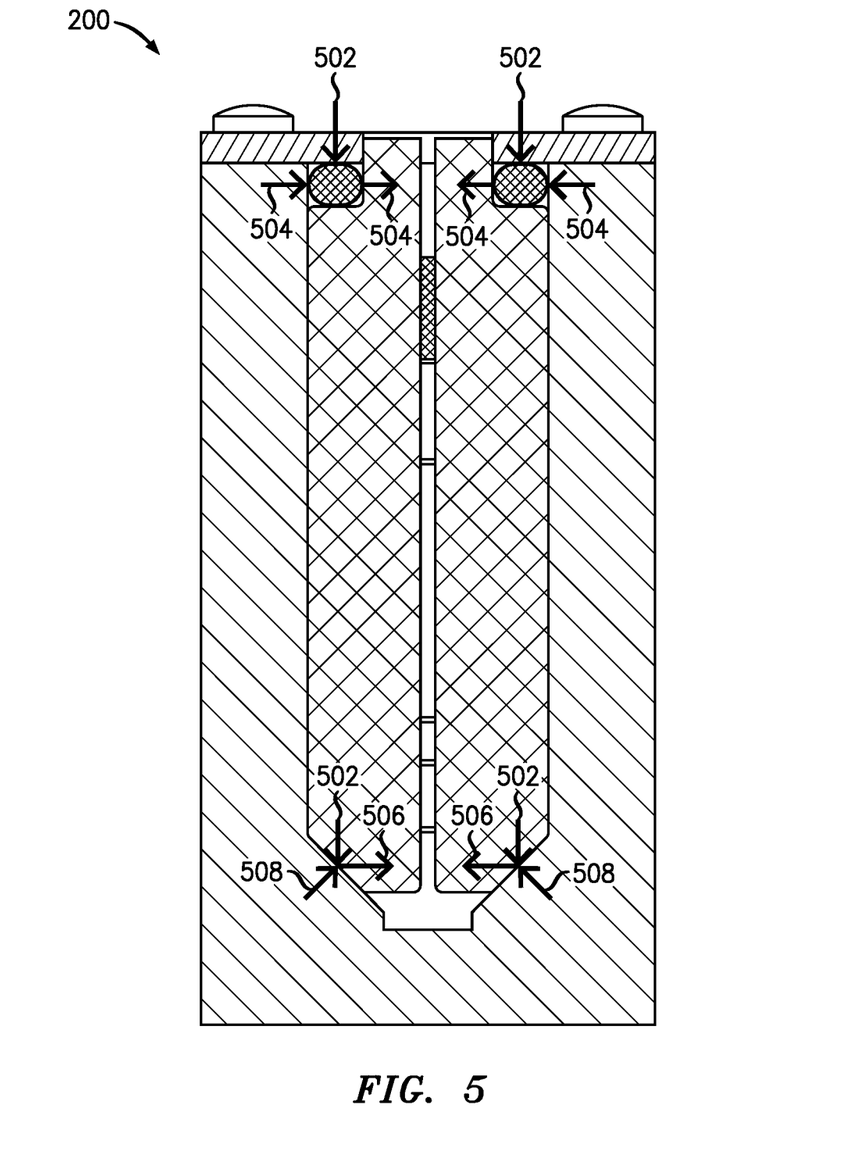
FIG. 5 illustrates a force diagram of the exemplary planar filter assembly.

FIG. 5 illustrates a force diagram of the planar filter assembly 200. A downward force 502 may be applied by the compression of the elastomer rings by the cover. An upper centering force 504 may be applied by the compression of the elastomer rings by the walls of the housing. The downward force 502 may translate to a lower centering force 506 by applying an angled force 508 on the angled surfaces of the housing.

Figure 6:
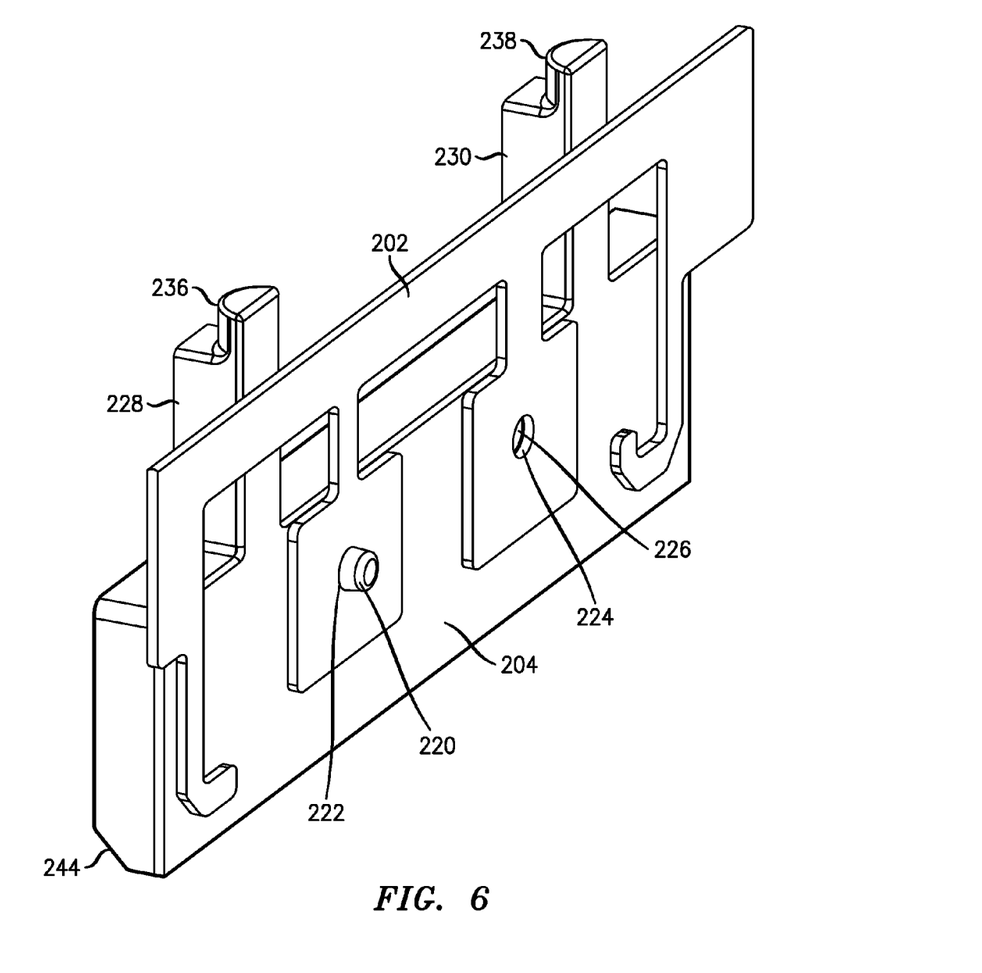
FIG. 6 illustrates an exemplary planar filter and an exemplary dielectric plate.

FIG. 6 illustrates the planar filter 202 and first dielectric plate 204. The planar filter may include the first and second alignment holes 222 and 224. The first dielectric plate 204 may include the first alignment pin 220, the second alignment pin receiver 226, the first support 228, the second support 230, the first upper self-alignment feature 236, the second upper self-alignment feature 238, and a first lower self-alignment feature 244.

The first and second supports 228 and 230 may contact a small area of the planar filter 202. Therefore, a large area of the upper beam of the planar filter 202 may be exposed to air. Air may provide the filter with a lower dielectric constant than the first and second dielectric plates 204 and 206. The dielectric constant of air may also be less variable than the dielectric plates 204 and 206 as temperature changes. The shape of the planar filter 202 may be altered depending on desired filter characteristics. However, various shapes of planar filters may benefit from the increased exposure to air.

Figure 7:
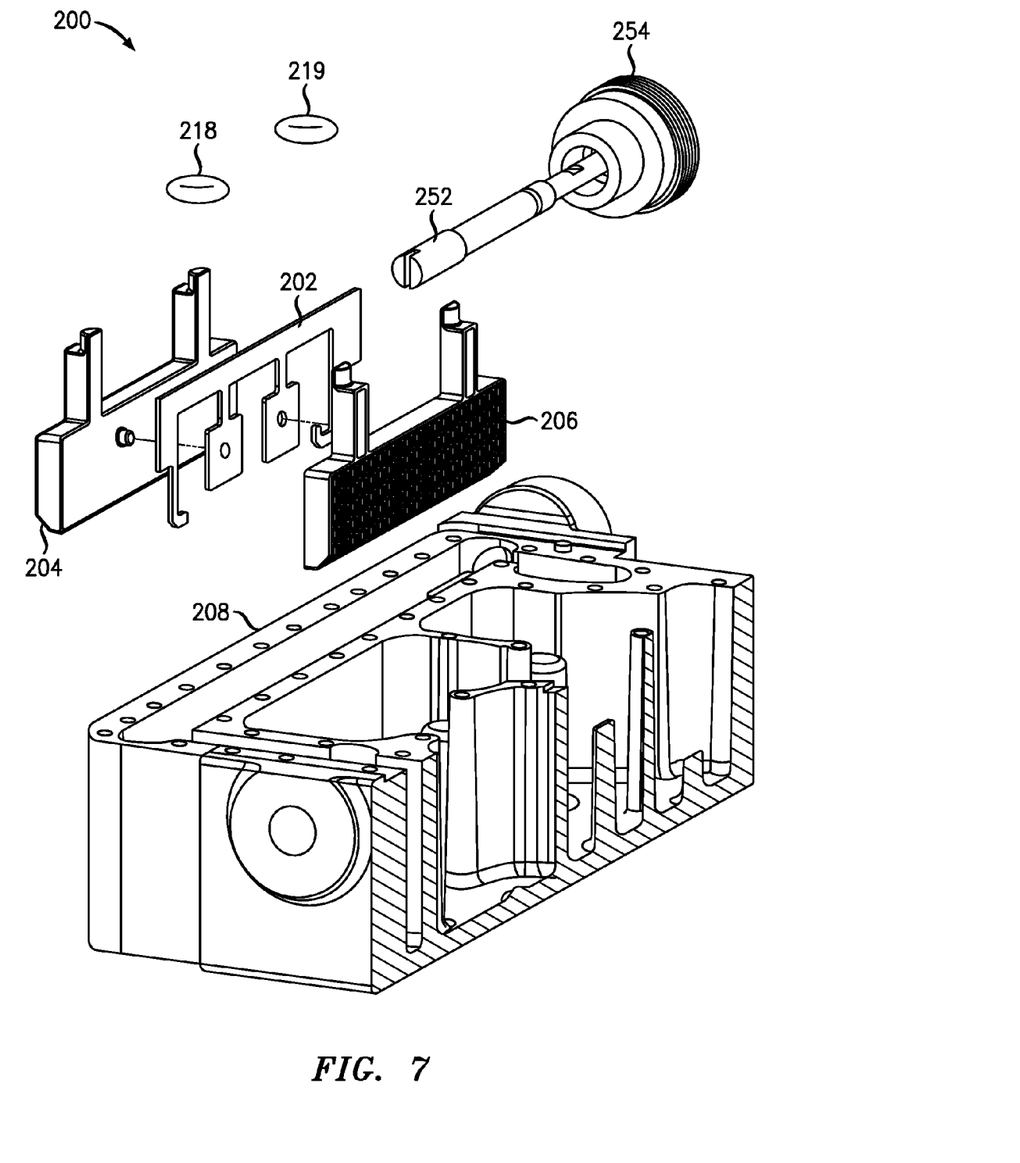
FIG. 7 illustrates an exploded view of an exemplary planar filter assembly.

FIG. 7 illustrates an exploded view of the planar filter assembly 200 with an exemplary embodiment of the housing 208. The planar filter assembly 200 may include the planar filter 202, the first dielectric plate 204, the second dielectric plate 206, the housing 208, the cover (not shown), the first elastomer ring 218, the second elastomer ring 219, a connector 252, and an input/output port 254. The connector 252 may provide an interface for the input/output port 254 to contact the planar filter 202. The input/output port may provide an interface for signals to be input and/or output to the planar filter assembly 200. While only one connector and input/output port are shown, additional connectors and input/output ports may be used with the planar filter 202.

Figure 8:
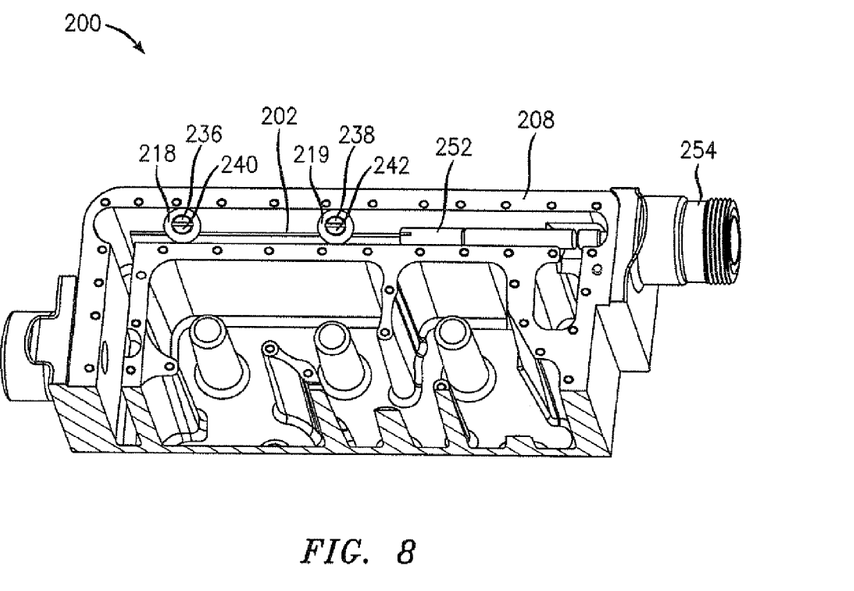
FIG. 8 illustrates an assembled view of the exemplary planar filter assembly of FIG. 7.

FIG. 8 illustrates an assembled view of the planar filter assembly 200 with the exemplary embodiment of the housing 208. The housing 208 and cover (not shown) may substantially surround the planar filter 202, the connector 254, the first and second elastomer rings 218 and 219, and the first and second dielectric plates (not shown). The input/output port 254 may protrude from the housing 208. The first elastomer ring 218 may encircle the first and third upper self-alignment features 236 and 240. The second elastomer ring 219 may encircle the second and fourth upper self-alignment features 238 and 242.

Although the various exemplary embodiments have been described in detail with particular reference to certain exemplary aspects thereof, it should be understood that the invention is capable of other embodiments and its details are capable of modifications in various obvious respects. As is readily apparent to those skilled in the art, variations and modifications can be affected while remaining within the spirit and scope of the invention. Accordingly, the foregoing disclosure, description, and figures are for illustrative purposes only and do not in any way limit the invention, which is defined only by the claims.

What is claimed is:

1. An assembly, comprising:
   a housing;
   a planar filter;
   a first dielectric plate having a first angled surface; and
   a second dielectric plate having a second angled surface, wherein the planar filter is supported between the first dielectric plate and the second dielectric plate, and wherein the first angled surface and the second angled surface translate a downward force to an inward force and interact with the housing to apply the inward force on the planar filter.

2. The assembly of claim 1, further comprising:
   at least one compressible ring, wherein the at least one compressible ring acts on the first dielectric plate and the second dielectric plate to apply the inward force on the planar filter.

3. The assembly of claim 2, further comprising:
a cover, wherein the cover compresses the at least one compressible ring.

4. The assembly of claim 3, wherein the housing is u-shaped with angled surfaces at the inner corners of the u-shape, and wherein the at least one compressible ring causes the first angled surface of the first dielectric plate and the second angled surface of the second dielectric plate to interact with the angled surfaces of the housing to apply the inward force on the planar filter.

5. The assembly of claim 2, wherein the housing compresses the at least one compressible ring.

6. The assembly of claim 5, wherein the at least one compressible ring, the first angled surface of the first dielectric plate, and the second angled surface of the second dielectric plate interact with the housing to keep the planar filter substantially centered within the housing.

7. The assembly of claim 1, wherein the first dielectric plate has at least one support post for contacting a first portion of the planar filter, and the second dielectric plate has at least one support post for contacting a second portion of the planar filter, and wherein portions of the planar filter not contacted by the first dielectric plate and the second dielectric plate are exposed to air.

8. The assembly of claim 1, wherein the first dielectric plate has a first alignment pin and a first alignment pin receiver, and the second dielectric plate has a second alignment pin and a second alignment pin receiver, and wherein the first alignment pin extends through a first hole in the planar filter into the second alignment pin receiver, and the second alignment pin extends through a second hole in the planar filter into the first alignment pin receiver.

9. The assembly of claim 1, wherein the first dielectric plate and the second dielectric plate are substantially identical.

10. An assembly, comprising:
a housing;
a planar filter;
a first dielectric plate;
a second dielectric plate; and
at least one compressible ring, wherein the planar filter is supported between the first dielectric plate and the second dielectric plate, and wherein the at least one compressible ring acts on the first dielectric plate and the second dielectric plate to apply a downward force that is translated to an inward force applied to the planar filter.

11. The assembly of claim 10, wherein the first dielectric plate has a first angled surface, and the second dielectric plate has a second angled surface, and wherein the first angled surface and the second angled surface interact with the housing to apply the inward force on the planar filter.

12. The assembly of claim 11, further comprising:
a cover, wherein the cover compresses the at least one compressible ring.

13. The assembly of claim 12, wherein the housing is u-shaped with angled surfaces at the inner corners of the u-shape, and wherein the at least one compressible ring causes the first angled surface of the first dielectric plate and the second angled surface of the second dielectric plate to interact with the angled surfaces of the housing to apply the inward force on the planar filter.

14. The assembly of claim 10, wherein the housing compresses the at least one compressible ring.

15. The assembly of claim 11, wherein the at least one compressible ring, the first angled surface of the first dielectric plate, and the second angled surface of the second dielectric plate interact with the housing to keep the planar filter substantially centered within the housing.

16. The assembly of claim 11, wherein the first dielectric plate has at least one support post for contacting a first portion of the planar filter, and the second dielectric plate has at least one support post for contacting a second portion of the planar filter, and wherein portions of the planar filter not contacted by the first dielectric plate and the second dielectric plate are exposed to air.

17. The assembly of claim 11, wherein the first dielectric plate has a first alignment pin and a first alignment pin receiver, and the second dielectric plate has a second alignment pin and a second alignment pin receiver, and wherein the first alignment pin extends through a first hole in the planar filter into the second alignment pin receiver, and the second alignment pin extends through a second hole in the planar filter into the first alignment pin receiver.

18. The assembly of claim 11, wherein the first dielectric plate and the second dielectric plate are substantially identical.

19. An assembly, comprising:
a u-shaped housing with angled surfaces at the inner corners of the u-shape;
a first dielectric plate having a first angled surface in contact with one of the angled surfaces of the housing;
a second dielectric plate having a second angled surface in contact with the other angled surface of the housing;
at least one compressible ring; and
a cover, wherein the planar filter is supported between the first dielectric plate and the second dielectric plate, wherein the cover compresses the at least one compressible ring to apply a downward force on the first and second dielectric plates, wherein the downward force is translated to an inward force by the angled surfaces of the housing, and wherein the angled surfaces of the housing apply the inward force on the first dielectric plate and the second dielectric plate.

20. The assembly of claim 19, wherein the at least one compressible ring, the first angled surface of the first dielectric plate, and the second angled surface of the second dielectric plate interact with the housing to keep the planar filter substantially centered within the housing.

* * * * *